(12) United States Patent
Reinprecht et al.

(10) Patent No.: US 10,404,051 B2
(45) Date of Patent: Sep. 3, 2019

(54) PROTECTIVE CIRCUIT AND METHOD FOR PROTECTING A CIRCUIT

(71) Applicant: ams AG, Unterpremstaetten (AT)

(72) Inventors: Wolfgang Reinprecht, Tobelbad (AT); Christian Stockreiter, Graz (AT); Bernhard Weiss, Graz (AT)

(73) Assignee: ams AG, Unterpremstaetten (AT)

( * ) Notice: Subject to any disclaimer, the term of this patent is extended or adjusted under 35 U.S.C. 154(b) by 116 days.

(21) Appl. No.: 15/589,916

(22) Filed: May 8, 2017

(65) Prior Publication Data

US 2017/0243863 A1  Aug. 24, 2017

Related U.S. Application Data

(62) Division of application No. 14/424,978, filed as application No. PCT/EP2013/066922 on Aug. 13, 2013, now Pat. No. 9,673,607.

(30) Foreign Application Priority Data

Aug. 31, 2012  (DE) ........................ 10 2012 108 105

(51) Int. Cl.
*H02H 1/00* (2006.01)
*H02H 9/04* (2006.01)
*H01L 27/02* (2006.01)

(52) U.S. Cl.
CPC ....... *H02H 1/0007* (2013.01); *H01L 27/0259* (2013.01); *H02H 9/04* (2013.01); *H02H 9/046* (2013.01)

(58) Field of Classification Search
CPC .... H01L 27/0259; H02H 1/0007; H02H 9/04; H02H 9/046
USPC .......................................... 361/56
See application file for complete search history.

(56) References Cited

U.S. PATENT DOCUMENTS

| 6,690,555 | B1 | 2/2004 | Pasqualini |
| 7,102,862 | B1 | 9/2006 | Lien et al. |
| 7,672,100 | B2 | 3/2010 | Van Camp |
| 2003/0214768 | A1 | 11/2003 | Lin et al. |
| 2007/0121262 | A1 | 5/2007 | Loh et al. |
| 2009/0128969 | A1 | 5/2009 | Deval et al. |
| 2012/0002337 | A1 | 1/2012 | Parthasarathy et al. |
| 2012/0170160 | A1 | 7/2012 | Wang et al. |

*Primary Examiner* — Kevin J Comber
(74) *Attorney, Agent, or Firm* — Fish & Richardson P.C.

(57) ABSTRACT

A protective circuit (10) comprises a terminal (11), a reference potential terminal (12) and a protective structure (13) that is arranged between the terminal (11) and the reference potential terminal (12), and is designed to be conductive in the event of an electrostatic discharge. The protective circuit (10) furthermore comprises a voltage supply circuit (14) that is coupled to a control input (16) of the protective structure (13) with its output side and is designed for delivering, in the event of radiofrequency interference, a control signal (ST) to the control input (16) with such a high voltage value that conduction of the protective structure (13) is prevented.

13 Claims, 3 Drawing Sheets

PROTECTIVE CIRCUIT AND METHOD FOR PROTECTING A CIRCUIT

CROSS-REFERENCES TO RELATED APPLICATIONS

This application is a continuation application of U.S. patent application Ser. No. 14/424,978, filed Feb. 27, 2015, now U.S. Pat. No. 9,673,607, issued on Jun. 6, 2017, which is the national stage of International Patent Application No. PCT/EP2013/066922, filed Aug. 13, 2013, which claims the benefit of German Patent Application No. 102012108105.0 filed on Aug. 31, 2012, all of which are hereby incorporated by reference in their entirety for all purposes.

BACKGROUND OF THE INVENTION

The invention pertains to a protective circuit and a method for protecting a circuit.

A protective circuit usually serves for protecting a terminal from electrostatic discharge, abbreviated as ESD. Integrated circuits used in automobiles feature protective circuits. Integrated circuits of this type are used, for example, in a Local Interconnect Network, abbreviated as LIN.

However, radiofrequency interference (radio interference) may occur during the operation and can be verified with a test method that is based on Direct Power Injection, abbreviated as DPI. The frequencies in the event of radiofrequency interference lie between 1 MHz and 1 GHz. The high voltage level and the fast crossings of a radiofrequency interference signal cause a conventional protective structure to be conductive and a current to flow through the protective structure. A conventional protective structure therefore also reacts to these frequencies in order to ensure a reliable dissipation during an ESD event. The relevant frequency range affecting a protective structure usually lies between 1 MHz and 100 MHz. A protective circuit therefore should not trigger in the event of radiofrequency interference in order to prevent a fault at a node of the LIN and loss of communication.

Document US 2009/0128969 A1 describes an adaptive protection against ESD for a LIN bus. A protective structure comprises a field effect transistor that couples a terminal to a reference potential terminal. In the event of radiofrequency interference, a control terminal of the field effect transistor is connected to the reference potential terminal.

SUMMARY OF THE INVENTION

In one embodiment, a protective circuit comprises a terminal, a reference potential terminal, a protective structure and the voltage supply circuit. The protective circuit is arranged between the terminal and the reference potential terminal. The voltage supply circuit is coupled to a control input of the protective structure with its output side. The protective structure is designed to be conductive in the event of an electrostatic discharge. In the event of radiofrequency interference, the voltage supply circuit is designed to deliver a control signal to the control input with such a high voltage value that conduction of the protective structure is prevented.

During radiofrequency interference, a control signal with a high voltage value is advantageously generated such that the protective structure, the inactivation of which requires a high voltage value, is not conductive in the event of radiofrequency interference. The protective circuit therefore is advantageously designed to be conductive only in the event of an electrostatic discharge, but not in the event of radiofrequency interference.

The radiofrequency interference may be caused or reproduced by a Direct Power Injection. The voltage supply circuit may be designed to generate the control signal with the high voltage value during radiofrequency interferences in the range between 1 MHz and 1 GHz. The voltage supply circuit may be realized in such a way that it does not generate the high voltage value of the control signal at the terminal for a useful signal such as, e.g., a data signal. In one embodiment, the useful signal has a data rate of less than 1 MHz.

The terminal may be realized in the form of an input/output terminal. A bus, particularly a LIN bus, may comprise the terminal. The data rate of a terminal signal applied to the terminal may amount, for example, to no more than 1 MHz.

In one embodiment, the voltage supply circuit advantageously prevents communication carried out via the terminal from being disturbed by an increased power consumption or coupling. Even radiofrequency interference does not cause the communication to fail because the communication at the bus is not disturbed.

In one embodiment, switching on the protective structure does not lead to destruction of the protective structure. Even a DPI event does not cause destruction of the protective structure.

In one embodiment, the voltage supply circuit only prevents conduction of the protective structure in the event of radiofrequency interference. False triggering of the protective structure is therefore prevented. The protective structure is only conductive if an ESD event occurs, but not during a radiofrequency interference event.

In one embodiment, the terminal signal has frequencies between 1 MHz and 1 GHz during a radiofrequency interference event.

In one embodiment, a terminal signal occurring during radiofrequency interference has frequencies that are higher than a maximum working frequency. For example, the maximum working frequency may amount to 1 MHz.

In one embodiment, the voltage supply circuit is connected to the terminal with its input side.

In one embodiment, an output of the voltage supply circuit is connected to the control input. The output of the voltage supply circuit has a high impedance in the absence of radiofrequency interference. The voltage supply circuit therefore does not output a control signal in the absence of radiofrequency interference. Consequently, the protective structure can be triggered by an ESD event without any influence of the voltage supply circuit in the absence of radiofrequency interference. The protective structure is designed in such a way that it automatically triggers during an ESD event without involvement of the voltage supply circuit.

In one embodiment, the voltage supply circuit is implemented in the form of a charge pump that is connected to the terminal with a first input and to the control input of the protective structure with an output.

For example, the charge pump may generate the control signal from a terminal signal applied to the terminal and/or from a supply voltage fed to the charge pump. The charge pump selectively converts the terminal signal or the supply voltage into the control voltage depending on which of the two signals or voltages has the higher voltage value.

In one embodiment, a charge pump may be advantageously suitable for delivering a control voltage to the control input of the protective structure in the form of a voltage that is higher than the voltage currently fed to the charge pump.

In one embodiment, a method for protecting a circuit comprises the step of generating a control signal by means of a voltage supply circuit. The control signal is furthermore fed to a protective structure that is arranged between a terminal and a reference potential terminal. The protective structure is designed to be conductive in the event of an electrostatic discharge. In the event of radiofrequency interference, the control signal is generated with such a high voltage value that conduction of the protective structure is prevented.

The high voltage value of the control signal advantageously deactivates the triggering of the protective structure.

In one embodiment, a semiconductor body comprises a protective circuit with the protective structure and the voltage supply circuit. A circuit of the semiconductor body advantageously can also maintain signal communication during radiofrequency interference. This is particularly advantageous for a semiconductor body used in automobiles. Even frequencies of the radiofrequency interference between 1 MHz and 1 GHz do not cause triggering of the protective structure. During a radiofrequency interference event, a node of the Local Interconnect Network connected to the semiconductor body is not disturbed and no loss of communication occurs.

BRIEF DESCRIPTION OF THE DRAWINGS

Several embodiment examples of the invention are described in greater detail below with reference to figures. Components or circuit elements with identical function or effect are identified by the same reference symbols. The description of components or circuit elements that correspond with respect to their function is not repeated with reference to each of the following figures. In these figures.

DETAILED DESCRIPTION

Figure 1A:
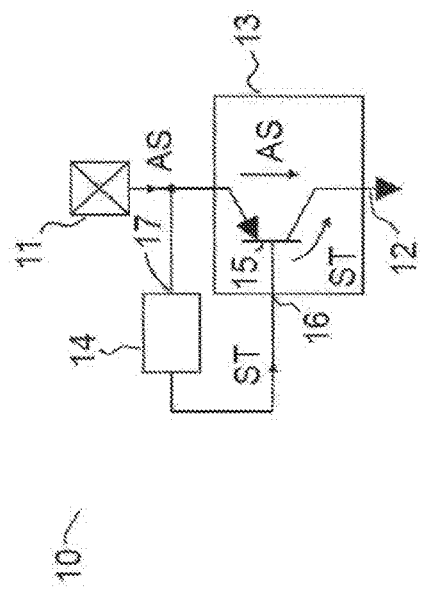
FIGS. 1A to 1K show embodiment examples of a protective circuit.

FIG. 1A shows an embodiment example of a protective circuit 10. The protective circuit 10 comprises a terminal 11, a reference potential terminal 12, a protective structure 13 and a voltage supply circuit 14. The terminal 11 may be realized, for example, in the form of an input/output pin. The terminal 11 typically is a terminal at which a radiofrequency interference event can occur. The protective structure 13 comprises a bipolar transistor 15. The bipolar transistor is implemented in the form of a PNP transistor. The bipolar transistor 15 comprises an emitter that is directly connected to the terminal 11. The bipolar transistor 15 also comprises a collector that is directly connected to the reference potential terminal 12. The bipolar transistor 15 furthermore comprises a base that is coupled to a control input 16 of the protective structure 13. The voltage supply circuit 14 is connected to the terminal 11 with a first input 17. An output of the voltage supply circuit 14 is connected to the control input 16. The voltage supply circuit 14 is implemented in the form of a charge pump that is connected to the terminal 11 with a first input and to the control input 16 with an output.

A terminal signal AS applied to the terminal 11 is fed to the voltage supply circuit 14. The voltage supply circuit 14 delivers a control signal ST. The voltage supply circuit 14 generates the control signal ST in dependence on the terminal signal AS. The control signal ST is fed to the control input 16 and therefore to the base of the bipolar transistor 15. The control signal ST is applied in the form of a voltage between the base and the collector of the bipolar transistor 15. The terminal signal AS drops between the emitter and the collector of the bipolar transistor 15. The protective structure 13 is conductive as soon as an electrostatic discharge occurs at the terminal 11. During an ESD event, the bipolar transistor 15 conducts current from the terminal 11 to the reference potential terminal 12.

In the event of radiofrequency interference, the voltage supply circuit generates the control signal ST with a voltage value that lies above a predefined voltage value. The protective structure 13 is only conductive at voltage values of the control signal ST that lie below the predefined voltage value. In the event of radiofrequency interference, conduction of the protective structure 13 therefore is prevented by the control signal ST that lies above the predefined voltage value. The charge pump is supplied with the voltage at the terminal 11. The capacitance at the terminal 11 is sufficiently high for driving the additional load caused by the charge pump without causing a disturbance of the terminal signal AS.

During a radiofrequency interference event, the base of the bipolar transistor 15 is biased by the control signal ST. In the event of radiofrequency interference, the control signal ST has such a high voltage that the bipolar transistor 15 is not conductive. During a radiofrequency interference event, the control signal ST has at least the voltage value of the terminal signal AS minus a cut-in voltage of a diode. In the event of radiofrequency interference, each active or parasitic component to which the control signal ST is applied likewise remains in the state of the inverse bias voltage such that triggering is prevented. The voltage supply circuit 14 is switched on in the event of radiofrequency interference.

The voltage supply circuit 14 is switched off while an ESD event occurs. Consequently, a voltage of the control signal ST is off during an ESD event. The base-emitter junction of the bipolar transistor 15 therefore is switched on during an ESD event and the ESD protection is activated such that the protective structure 13 is conductive. The protective structure 13 is self-triggering during an ESD event.

In one embodiment, the charge pump generates the voltage signal ST with a voltage value that is higher than the voltage value of the terminal signal AS. Since the voltage fed to the base of the bipolar transistor 15 is higher than the voltage at the terminal 11 and thus at the emitter of the bipolar transistor 15, conduction of the protective structure 13 is prevented during a radiofrequency interference event.

In a not-shown alternative embodiment, the control signal ST is fed to an additional node or terminal for supplying a circuit. In this way, the additional node, which should be biased in the event of radiofrequency interference, can be supplied by the voltage supply circuit 14.

Figure 1B:
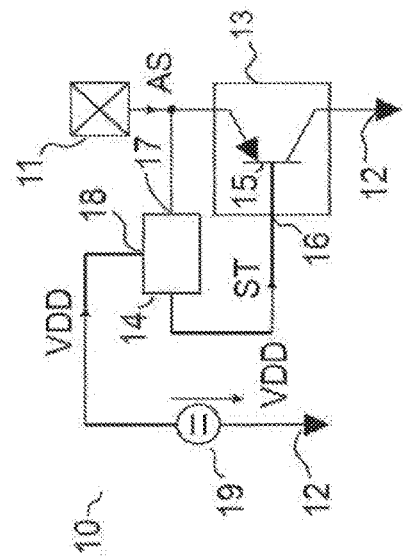

FIG. 1B shows another embodiment example of a protective circuit 10 that represents an enhancement of the embodiment illustrated in FIG. 1A. The voltage supply circuit 14 features a second input 18. The second input 18 is connected to a voltage source 19 of the protective circuit 10. A supply voltage VDD delivered by the voltage source 19 is fed to the second input 18. The voltage supply circuit 14 realized in the form of a charge pump therefore is supplied with the supply voltage VDD and with the terminal signal AS. In this way, a load at the terminal 11 caused by the voltage supply circuit 14 is advantageously reduced.

The voltage supply circuit 14 converts the terminal signal AS or the supply voltage VDD into the control signal ST. The voltage supply circuit 14 is designed for converting the terminal signal AS into the control signal ST when the voltage value of the terminal signal AS is higher than the value of the supply voltage VDD and for converting the supply voltage VDD into the control signal ST when the value of the supply voltage VDD is higher than the voltage value of the terminal signal AS. For example, the control signal ST may be equal to the higher voltage of a group that comprises the voltage of the terminal signal AS and the supply voltage VDD.

Depending on whichever voltage is higher, the supply voltage VDD on the one hand and the terminal signal AS on the other hand are converted into the control signal ST via the two inputs 17, 18 of the voltage supply circuit 14 or the charge pump, respectively. The higher voltage causes the base-collector diode and the base-emitter diode of the bipolar transistor 15 to be reverse-biased such that the space charge zones become wide and the capacitances become correspondingly low. This in turn reduces the current consumption during a DPI interference that decisively ensures the signal integrity. An excessively high current value would disturb the communication at the bus. The protective circuit 10, or ESD circuit, does not trigger except in the event of an ESD. Consequently, the protective circuit 10 does not affect the signals on the LIN bus that comprises the terminal 11 under the influence of interferences.

Figure 1C:
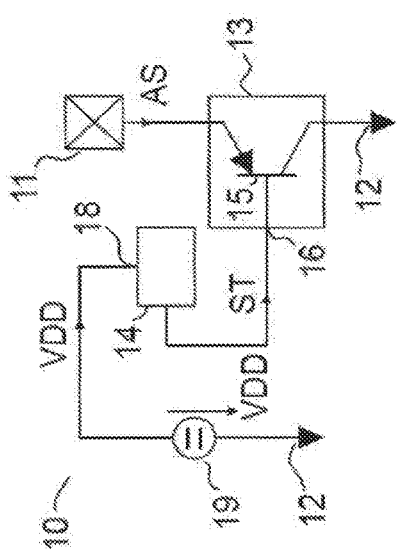

FIG. 1C shows another embodiment example of the protective structure 10 that represents an enhancement of the embodiments illustrated in FIGS. 1A and 1B. According to FIG. 1C, the voltage supply circuit 14 is supplied with the supply voltage VDD only. The voltage supply circuit 14 is not connected to the terminal 11. A protective circuit of this type can be used, for example, if the terminal signal AS and the supply voltage VDD are influenced in the event of radiofrequency interference. Consequently, it is not necessary to couple the terminal 11 to the voltage supply circuit 14 in order to detect the presence of radiofrequency interference. In this way, a load at the terminal 11 is advantageously further reduced.

Figure 1D:
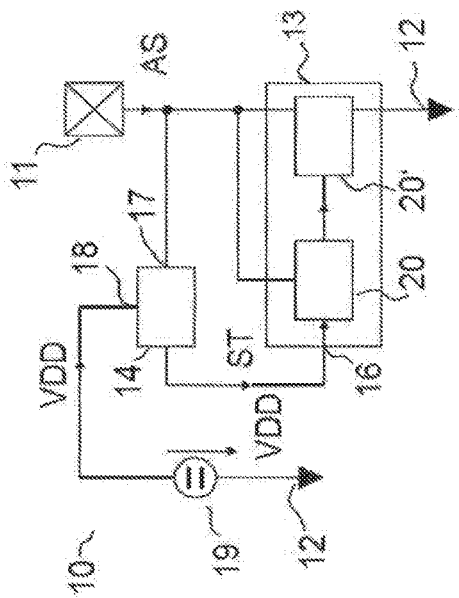

FIG. 1D shows another embodiment example of the protective circuit 10 that represents an enhancement of the embodiments illustrated in FIGS. 1A to 1C. The protective structure 13 comprises a trigger circuit 20 that is connected to the control input 16 with a first input. A second input of the trigger circuit 20 is connected to the terminal 11. An output of the trigger circuit 20 is connected to a control terminal of a protective structure component 20'. The protective structure component 20' may consist of the bipolar transistor 15 illustrated in FIGS. 1A to 1C. The trigger circuit 20 may therefore be connected to the base of the bipolar transistor 15. In order to preclude conduction of the protective structure 13 during a radiofrequency interference event, the protective structure component 20' is switched off by the voltage supply circuit 14 via the trigger circuit 20. The trigger circuit 20 therefore is deactivated in the event of a radiofrequency interference signal at the terminal 11. The trigger circuit 20 is deactivated due to the presence of the control signal ST that is above the predefined voltage value. The trigger circuit 20 is activated when no voltage is delivered by the voltage supply circuit 14 as control signal ST. As soon as the trigger circuit 20 detects an ESD event, it switches the protective structure 13 to conductive. In an ESD state, the supply voltage VDD and the voltage value of the terminal signal AS are usually not on the same voltage level.

Figure 1F:
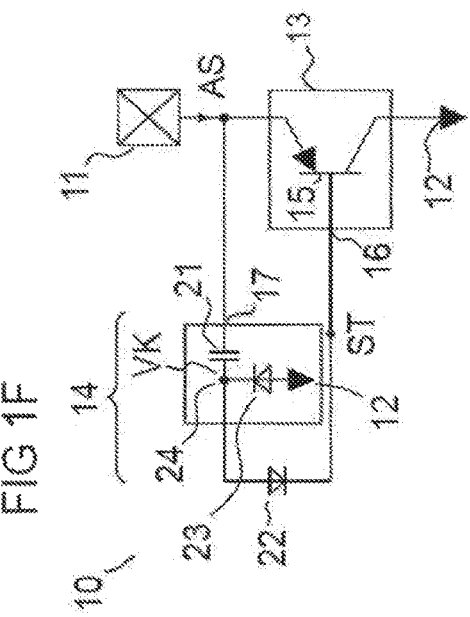
Figure 1H:
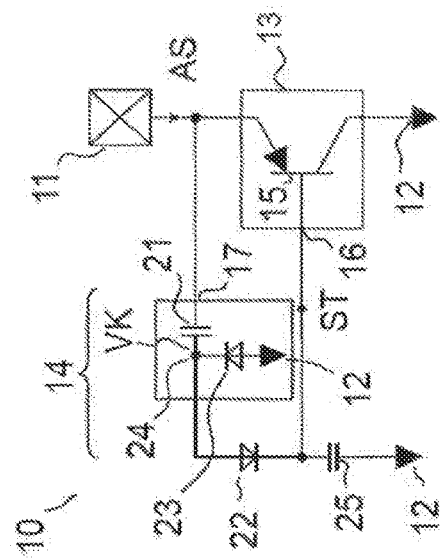
Figure 1E:
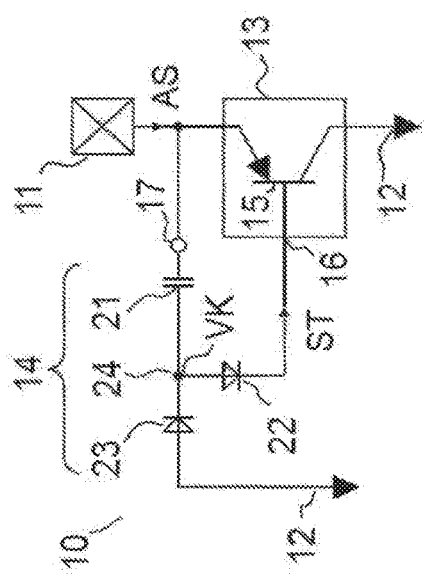

FIG. 1E shows another embodiment example of the protective circuit 10 that represents an enhancement of the embodiments illustrated in FIGS. 1A to 1D. The voltage supply circuit 14 comprises a coupling capacitor 21 and a first diode 22 that form a series circuit. The series circuit comprising the coupling capacitor 21 and the first diode 22 is arranged between the terminal 11 and the control input 16. In this case, the coupling capacitor 21 is connected to the terminal 11, and the first diode 22 is connected to the control input 16. An anode of the first diode 22 is connected to the coupling capacitor 21, and a cathode of the first diode 21 is connected to the control input 16. The voltage supply circuit 14 furthermore comprises a second diode 23 that connects the reference potential terminal 12 to a node 24 between the coupling capacitor 21 and the first diode 22. An anode of the second diode 23 is connected to the reference potential terminal 12, and a cathode of the second diode 23 is connected to the node 24.

In the event of radiofrequency interference, the terminal signal AS has frequencies, for example, in the range between 1 MHz and 1 GHz. Consequently, the coupling capacitor 21 represents only a slight impedance during a radiofrequency interference event. A node voltage VK at the node 24 therefore can assume high voltage values that lead to conduction of the first diode 22. High values of the node voltage VK consequently lead to a rise of the control signal ST. A control signal ST that has positive values causes blocking of the emitter-base diode of the bipolar transistor 15. The cathode of the first diode 22, the base of the bipolar transistor 15 and the strip conductor between the first diode 22 and the base of the bipolar transistor 15 form a parasitic capacitance that is charged by the series circuit consisting of the coupling capacitor 21 and the first diode 22, and stabilizes the voltage of the control signal ST at a high value.

Due to the second diode 23, the node voltage VK can assume the reference potential terminal 0 V minus the value of a cut-in voltage of the second diode 23 as a minimum value. Since the node voltage VK cannot assume a significantly negative value, the first diode 22 is not transferred into the state of a significantly blocking bias voltage. Consequently, the first diode 22 is immediately conductive and can generate a high voltage value of the control signal ST if the voltage of the terminal signal AS briefly assumes a high voltage value during a radiofrequency interference event. After the high-frequency interference event has ended, the voltage value of the control signal ST is decreased by parasitic currents through the first and the second diodes 22, 23, as well as the base-collector junction of the bipolar transistor 15. The first diode 22 represents a high-impedance output of the voltage supply circuit 14 in the absence of a radiofrequency interference event. The voltage supply circuit 14 advantageously features only very few components and can be realized in a space-saving fashion.

The first and the second diodes 22, 23 act as switches. The first and the second diodes 22, 23 are only conductive if a current flow through the respective diode leads to an increase of the voltage of the control signal ST. The biasing of the diodes 22, 23 is chosen such that a current flow through the respective diode increases the voltage of the control signal ST.

During a radiofrequency interference event, the terminal signal AS can have voltage values of plus/minus 40 V. Consequently, the embodiments of voltage supply circuits 14 illustrated in FIGS. 1A to 1K operate as charge pumps. The charge pump controls itself automatically.

In not-shown alternative embodiments, the diodes 22, 23, 26 may be replaced with actively controlled switches in FIGS. 1E to 1I. These switches are actuated by a not-shown control unit. This makes it possible to implement a charge pump that is actively controlled by a control unit.

FIG. 1F shows another embodiment example of the protective circuit 10 that represents an enhancement of the embodiments illustrated in FIGS. 1A to 1E. The second diode 23 and the coupling capacitor 21 are jointly integrated into a component of a semiconductor body that features the protective circuit 13.

Figure 1G:
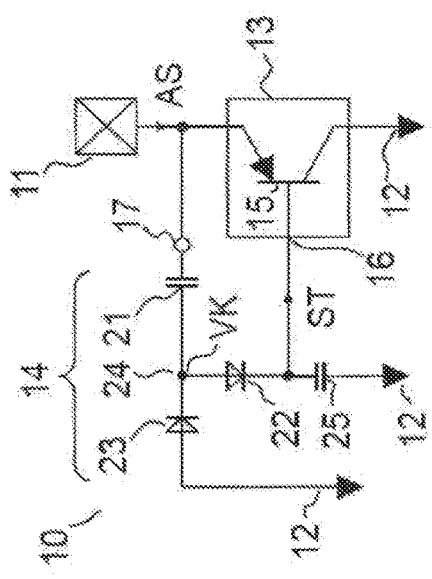

FIG. 1G shows another embodiment example of the protective circuit 10 that represents an enhancement of the embodiments illustrated in FIGS. 1A to 1F. The voltage supply circuit 14 additionally comprises a buffer capacitor 25. The buffer capacitor 25 is arranged between the control input 16 and the reference potential terminal 12. The buffer capacitor 25 is charged by the series circuit consisting of the coupling capacitor 21 and the first diode 22. The control signal ST is a voltage that drops across the buffer capacitor 25. The buffer capacitor 25 therefore stabilizes the control signal ST. In the event of radiofrequency interference, the control signal ST has a voltage value that is higher than or equal to the voltage value of the terminal signal AS minus a cut-in voltage of a diode such that the base-emitter diode blocks and the bipolar transistor 15 is not conductive. Consequently, triggering of the bipolar transistor 15 is prevented in the event of radiofrequency interference.

FIG. 1H shows another embodiment example of the protective circuit 10 that represents an enhancement of the embodiments illustrated in FIGS. 1A to 1G. As in FIG. 1F, the second diode 23 and the coupling capacitor 21 are in FIG. 1H also integrated into the semiconductor body in the form of a component on a surface.

Figure 1J:
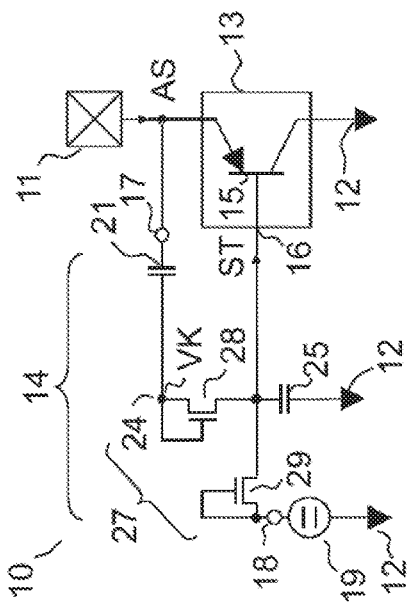
Figure 1I:
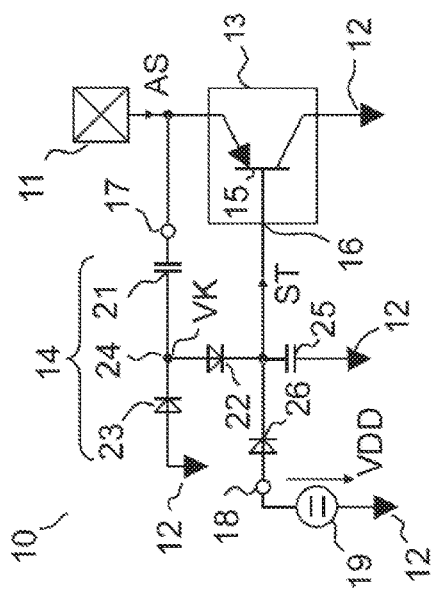

FIG. 1I shows another embodiment example of the protective circuit 10 that represents an enhancement of the embodiments illustrated in FIGS. 1A to 1H. The protective circuit 10 features the voltage source 19. The voltage supply circuit 14 comprises an additional diode 26 that connects the voltage source 19 to the control input 16. The supply voltage VDD is therefore fed to the control input 16 via the additional diode 26. The higher of the two voltages, namely the supply voltage VDD or the node voltage VK at the node 24 between the coupling capacitor 21 and the first diode 22, consequently defines the control signal ST. This means that the control signal ST is the higher of the two voltages, namely the supply voltage VDD minus the cut-in voltage of the first diode 22, or the node voltage VK minus the cut-in voltage of the additional diode 26.

FIG. 1J shows another embodiment example of the protective circuit that represents an enhancement of the embodiments illustrated in FIGS. 1A to 1I. The protective circuit comprises a switching matrix 27. A first input of the switching matrix 27 is coupled to the terminal 11 via the coupling capacitor 21. A second input of the switching matrix 27 is connected to the voltage source 19. An output of the switching matrix 27 is connected to the control terminal 16. The switching matrix 27 comprises a first and a second transistor 28, 29 that respectively connect the first and the second input of the switching matrix 27 to the output of the switching matrix 27. A series circuit comprises the coupling capacitor 21 and a controlled section of the first transistor 28 and is arranged between the terminal 11 and the control input 16. A control terminal of the first transistor 28 is connected to the node 24 between the coupling capacitor 21 and the controlled section of the first transistor 28.

The second transistor 29 is arranged between the voltage source 19 and the control input 16. A control terminal of the second transistor 29 is connected to a node between the voltage source 19 and the controlled section of the second transistor 29. The first and the second transistors 28, 29 are realized in the form of field effect transistors. The first and the second transistors 28, 29 are implemented in the form of n-channel metal oxide semiconductor field effect transistors. If the control signal ST is lower than the node voltage VK at the node 24, the first transistor 28 is conductive and charges the buffer capacitor 25. However, if the control signal ST is lower than the supply voltage VDD, the second transistor 29 is conductive and charges the buffer capacitor 25. The first and the second transistors 28, 29 therefore are provided instead of the first and the additional diodes 22, 26. The first and the additional diodes 22, 26 therefore can be implemented in the form of transistors 28, 29 that are switched as diodes.

Figure 1K:
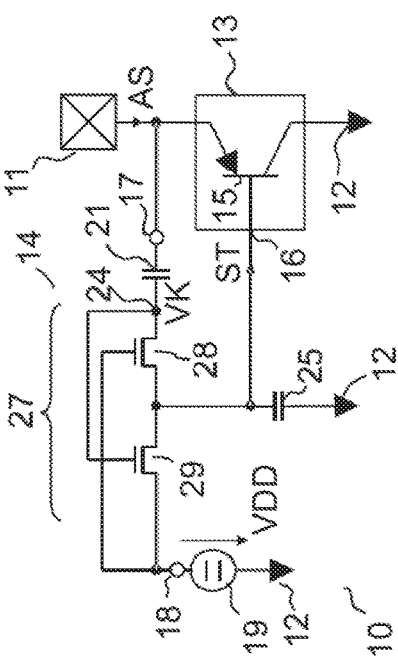

FIG. 1K shows another embodiment example of the protective circuit 10 that represents an enhancement of the embodiments illustrated in FIGS. 1A to 1J. The control terminal of the first transistor 28 is connected to the node between the voltage source 19 and the controlled section of the second transistor 29. The control terminal of the second transistor 29, in contrast, is connected to the node 24 between the controlled section of the first transistor 28 and the coupling capacitor 21. The first and the second transistors 28, 29 are implemented in the form of p-channel metal oxide semiconductor field effect transistors. Consequently, the switching matrix 27 itself generates the required control signals for the first and the second transistors 28, 29. If the supply voltage VDD is lower than the node voltage VK, the first transistor 28 is conductive and the second transistor 29 blocks. However, if the node voltage VK is lower than the supply voltage VDD, the second transistor 29 is conductive and the first transistor 28 blocks.

Figure 2:
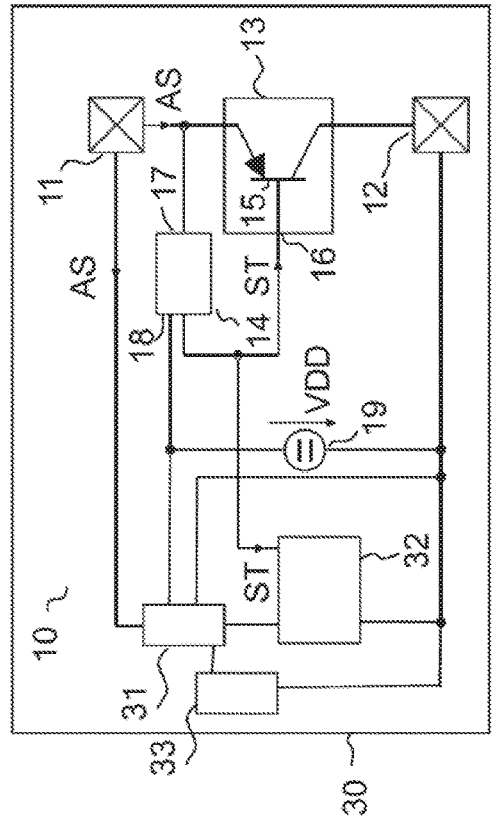
FIG. 2 shows an embodiment example of a semiconductor body with the protective circuit.

FIG. 2 shows an embodiment example of a semiconductor body 30 that comprises the protective circuit 10 according to one of the embodiments illustrated in FIGS. 1A to 1K. The semiconductor body 30 furthermore comprises a driver 31 that is connected to the terminal 11. The driver 31 is realized in the form of an input driver. The driver 31 may alternatively also be realized in the form of an output driver or in the form of an input/output driver. The semiconductor body 30 also comprises a circuit 32 that is connected to the voltage supply circuit 14. The circuit 32 is coupled to the terminal 11 via the driver 31. The control signal ST is fed to the circuit 32. After the radiofrequency interference event has ended, for example, the circuit 32 can advantageously repeat a measurement of a sensor signal or the output of a digital or analog signal. The circuit 32 may be implemented in the form of an analog circuit, a digital circuit or a mixed digital/analog circuit. The protective circuit 10 features an additional circuit 33 that is coupled to the terminal 11 via the driver 31. The terminal 11 is realized in the form of an input/output terminal. The additional circuit 33 may be realized in the form of an analog circuit, a digital circuit or a mixed digital/analog circuit.

The invention claimed is:
1. A protective circuit comprising:
a terminal,
a reference potential terminal, a protective structure that is arranged between the terminal and the reference potential terminal and is configured to be conductive in the event of an electrostatic discharge, and a voltage supply circuit that is operable to deliver, in the event of radiofrequency interference, a control signal to a control input of the protective structure with such a voltage value that conduction of the protective structure is prevented, wherein the voltage supply circuit comprises a switching matrix having:
a first input that is coupled to the terminal,
a second input, to which a supply voltage is fed, and
an output that is coupled to the control input,
wherein the control signal is generated from the higher of the two voltages applied to the first and the second input.

2. The protective circuit according to claim 1, wherein the protective circuit is configured not to conduct in the event of radiofrequency interference.

3. The protective circuit according to claim 1, wherein the protective structure contains a bipolar transistor that comprises:
an emitter that is coupled to the terminal,
a base that is coupled to the control input, and
a collector that is coupled to the reference potential terminal.

4. The protective circuit according to claim 3, wherein the bipolar transistor is implemented in the form of a PNP bipolar transistor.

5. The protective circuit according to claim 1, wherein the voltage supply circuit comprises a buffer capacitor that connects the control input to the reference potential terminal.

6. The protective circuit according to claim 1, wherein the switching matrix comprises a first and a second transistor that connect the first and the second input of the switching matrix to the output of the switching matrix.

7. The protective circuit according to claim 6, wherein the first and the second transistor are realized in the form of field effect transistors.

8. The protective circuit according to claim 6, wherein the protective circuit comprises a coupling capacitor and the first input of the switching matrix is coupled to the terminal via the coupling capacitor.

9. The protective circuit according to claim 8, wherein the protective circuit comprises a first transistor and
wherein a series circuit comprises the coupling capacitor and a controlled section of the first transistor and is arranged between the terminal and the control input.

10. The protective circuit according to claim 6, wherein the protective circuit comprises a voltage source and the second input of the switching matrix is connected to the voltage source.

11. The protective circuit according to claim 10, wherein the protective circuit comprises a second transistor and
wherein the second transistor is arranged between the voltage source and the control input.

12. A protective circuit comprising:
a terminal,
a reference potential terminal,
a protective structure that is arranged between the terminal and the reference potential terminal and is configured to be conductive in the event of an electrostatic discharge, and
a voltage supply circuit that is operable to deliver, in the event of radiofrequency interference, a control signal to a control input of the protective structure with such a voltage value that conduction of the protective structure is prevented,
wherein the voltage supply circuit comprises a switching matrix having:
a first input that is coupled to the terminal,
a second input, to which a supply voltage is fed,
an output that is coupled to the control input, and
a first and a second transistor that connect the first and the second input of the switching matrix to the output of the switching matrix,
wherein the control signal is generated from the higher of the two voltages applied to the first and the second input.

13. A protective circuit comprising:
a terminal,
a reference potential terminal,
a protective structure that is arranged between the terminal and the reference potential terminal and is configured to be conductive in the event of an electrostatic discharge,
wherein the protective circuit comprises:
a voltage source, and
a second transistor, and
a voltage supply circuit that is operable to deliver, in the event of radiofrequency interference, a control signal to a control input of the protective structure with such a voltage value that conduction of the protective structure is prevented,
wherein the voltage supply circuit comprises a switching matrix having:
a first input that is coupled to the terminal,
a second input, to which a supply voltage is fed, and
an output that is coupled to the control input,
wherein the control signal is generated from the higher of the two voltages applied to the first and the second input,
wherein the second input of the switching matrix is connected to the voltage source, and
wherein the second transistor is arranged between the voltage source and the control input.

* * * * *

UNITED STATES PATENT AND TRADEMARK OFFICE
CERTIFICATE OF CORRECTION

PATENT NO. : 10,404,051 B2
APPLICATION NO. : 15/589916
DATED : September 3, 2019
INVENTOR(S) : Wolfgang Reinprecht, Christian Stockreiter and Bernhard Weiss It is certified that error appears in the above-identified patent and that said Letters Patent is hereby corrected as shown below:

In the Specification

Column 1
Line 1, delete "Division" and insert -- Continuation --.

Column 1
Line 3, delete "CROSS-REFERENCES" and insert -- CROSS-REFERENCE --.

In the Claims

Column 9, Claim 8:
Line 43, delete "claim 6," and insert -- claim 1, --.

Column 9, Claim 10:
Line 53, delete "claim 6," and insert -- claim 1, --.

Signed and Sealed this
Twenty-ninth Day of October, 2019

Andrei Iancu
*Director of the United States Patent and Trademark Office*